United States Patent [19]

Sin

[11] Patent Number: 5,180,938

[45] Date of Patent: Jan. 19, 1993

[54] SIGNAL DELAY CIRCUIT HAVING SPECIFIED TRANSISTOR THRESHOLD LEVELS

[75] Inventor: Yun-seung Sin, Kyunggi, Rep. of Korea

[73] Assignee: Samsung Electronics Co., Ltd., Suwon, Rep. of Korea

[21] Appl. No.: 715,624

[22] Filed: Jun. 14, 1991

[30] Foreign Application Priority Data

Mar. 21, 1991 [KR] Rep. of Korea .................. 91-4505

[51] Int. Cl.$^5$ .................... H03K 5/13; H03K 3/26
[52] U.S. Cl. ................................ 307/605; 307/603; 307/594; 307/443; 307/320; 307/296.5; 307/296.8
[58] Field of Search ............... 307/296.1, 296.4, 296.5, 307/296.8, 491, 320, 443, 451, 603, 605, 591, 594

[56] References Cited

U.S. PATENT DOCUMENTS

| | | | |
|---|---|---|---|
| 4,931,668 | 6/1990 | Kikuda et al. | 307/443 |
| 4,994,695 | 2/1991 | Bazes | 307/605 |
| 5,051,630 | 9/1991 | Kogan et al. | 307/451 |

OTHER PUBLICATIONS

IBM Tech. Disc. Bul., "Device Parameter Independent Delay Circuit", vol. 31, No. 1, Jun. 1988.

Primary Examiner—William L. Sikes
Assistant Examiner—Margaret Rose Wambach
Attorney, Agent, or Firm—Rothwell, Figg & Kurz

[57] ABSTRACT

A signal delay circuit, includes a driving circuit for driving an output signal with a voltage swing between a supply voltage and a ground voltage. The signal delay circuit further includes a load capacitive means which is coupled to the output signal and has a larger value than the absolute value of the threshold voltage of the driving circuit and has a C-V characteristic curve which keeps a first capacitive value until the output voltage of the signal delay circuit reaches a first voltage and increases to a second capacitive value there and keeps the second capacitive value until the output voltage the reaches a second voltage and decreases to a third capacitive value there and keeps the third capacitive value; and which keeps a first capacitive value until the output voltage reaches a first voltage and decreases to a second capacitive value and keeps the second capacitive value until the output voltage reaches a second voltage and increases to a third capacitive value there and keeps the third capacitive value. The load capacitive means keeps the delay characteristic of the signal delay circuit independently of the change of the supply voltage and is able to increase the operating speed at a low operating voltage.

16 Claims, 9 Drawing Sheets

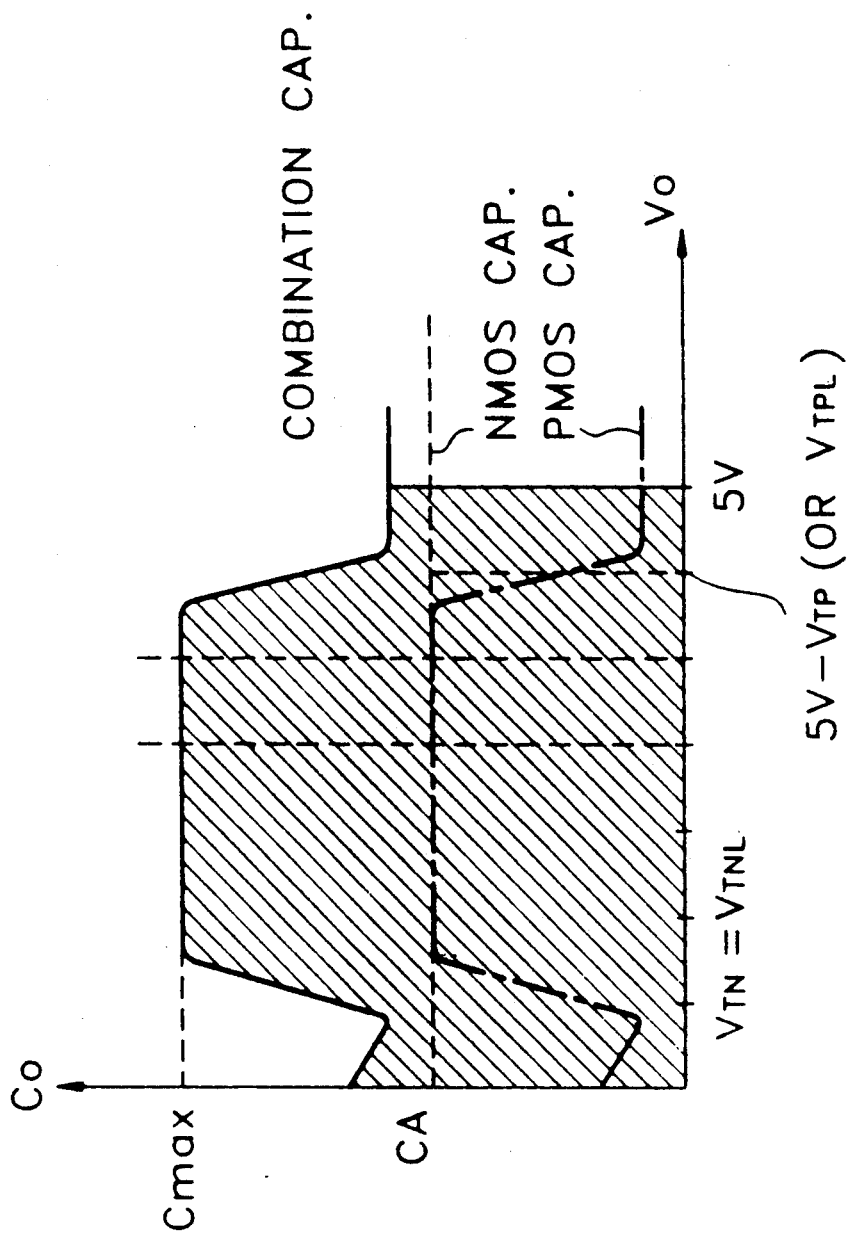

SIGNAL DELAY CIRCUIT HAVING SPECIFIED TRANSISTOR THRESHOLD LEVELS

FIELD OF THE INVENTION

The present invention relates to a signal delay circuit and more particularly to a signal delay circuit of a CMOS semiconductor integrated circuit chip.

BACKGROUND OF THE INVENTION

Generally, a circuit system integrated on a semiconductor chip is operated by receiving a supply voltage (Vcc) supplied from an outside source. A CMOS semiconductor chip usually uses a nominal single voltage of 5 V as the supply voltage. However, although a CMOS semiconductor chip is given a supply voltage tolerance of ±10%, the chip actually has an operating voltage in the range of 4 V to 6 V.

Usually, the circuit system of a CMOS semiconductor chip includes a signal delay circuit to achieve the purpose of a special circuit. In the CMOS circuit system, a signal delay circuit having a prescribed delay time is formed that uses the signal transmission delay time of the gate. For instance, a CMOS signal delay circuit using CMOS inverters is illustrated in FIG. 1A. This circuit comprises a first CMOS inverter DRV to drive a capacitive load CL according to an input signal VIN, and a second CMOS inverter BTT as a buffer amplifier for buffering and outputting a terminal voltage signal Vo of the capacitive load CL.

The terminal voltage signal Vo of the capacitive load CL has a delay characteristic with respect to the input signal VIN as shown in FIG. 1B. In detail, the capacitive load CL is charged by supply voltage Vcc through pull-up PMOS transistor PM and discharged by a ground voltage Vss or OV through pull-down NMOS transistor NM of the first CMOS inverter DRV. Therefore, the delay time Td is determined by the voltage fall time Tf and the voltage rise time Tr according to the following equation:

$$Td = \tfrac{1}{2}(Tf + Tr) \quad (1)$$

Here, on the assumption that the threshold voltages VTN and VTP of the MOS transistors NM and PM are approximately 0.2 Vcc and the current driving capability $\beta N$, $\beta P$ of the MOS transistors NM and PM are equal to each other, the above equation (1) can be rewritten as the following equation;

$$Td = \frac{2CL}{\beta Vcc} \quad (2)$$

Referring to the above equation (2), it is seen that the delay time Td is proportional to the capacitance of the capacitive load CL and inversely proportional to the supply voltage Vcc.

Accordingly, if the capacitance of the capacitive load CL is set to a fixed value, the delay time Td, as shown in FIG. 1C, varies inversely with respect to the fluctuation of the supply voltage Vcc.

Therefore, the effective load capacitance Ceff has a disadvantage in that the delay characteristic varies greatly according to the operating voltage level as a very small fluctuation of the effective load capacitance occurs according to the variation of the supply voltage Vcc.

Also, the variation of the delay characteristic according to the fluctuation of the operating voltage causes a race-around condition problem in high speed operation especially at a high operating voltage and is a cause of misoperation. In order to prevent this, if the delay time at the high operating voltage is lengthened, it greatly impedes the high speed operation at a low operating voltage. That's why the threshold voltages VTN, VTP of the transistors of the driving circuit DRV are set equal to the threshold voltages VTNL, VTPL of the capacitive load CL. Usually, the threshold voltage of an NMOS and PMOS capacitor can be easily controlled by implantation of III-V group elements, for example, Boron(B) phosphorous(P), or Arsenic(As), in the channel region of the capacitor before the deposition of polysilicon used as a gate electrode.

SUMMARY OF THE INVENTION

Therefore, it is an object of the present invention to provide a signal delay circuit that is able to minimize variation of the delay characteristic regardless of fluctuation of the supply voltage by having the absolute value of a threshold voltage of a capacitor used as a capacitive load be larger than those of the threshold voltages of the driving circuit transistors PMOS, NMOS.

It is another object of the present invention to provide a signal delay circuit which is able to increase the operating speed at a low operating voltage.

To achieve the above objects, the signal delay circuit according to the present invention comprises a driving circuit means receiving an input signal, which is coupled between a supply voltage and a ground voltage and includes a pull-up means and pull-down means having respective predetermined threshold voltages, and a common drain node for said pull-up means and said pull-down means; and load capacitive means, which is coupled to said common drain node and has at least one threshold voltage value which is larger than the corresponding absolute values of the threshold voltage of said pull up/down means for receiving an output signal of the driving circuit means, of the driving circuit means, whereby the load capacitance characteristic of the signal delay circuit keeps a first capacitive value until the output voltage of the signal delay circuit reaches a first output voltage and then increases to a second capacitive value at the first voltage and keeps the second capacitive value until the output voltage reaches a second output voltage and decreases to a third capacitive value at the second voltage and keeps the third capacitive value thereafter; and whereby the load capacitance characteristic of the signal delay circuit keeps a first capacitive value until the output voltage of the signal delay circuit reaches a first voltage and decreases to a second capacitive value at the first voltage and keeps the second capacitive value until the output voltage reaches a second voltage and increases to a third capacitive value at the second voltage and keeps the third capacitive value thereafter.

BRIEF DESCRIPTION OF THE DRAWINGS

The above objects and other advantages of the present invention will become more apparent by describing the preferred embodiments of the present invention with reference to the attached drawings, in which:

FIG. 2B illustrates the C-V characteristic of the circuit shown in FIG. 2A;

DETAILED DESCRIPTION OF THE INVENTION

First, to further the understanding of the present invention the conventional signal delay circuit will be explained prior to describing the present invention.

Figure 1A:
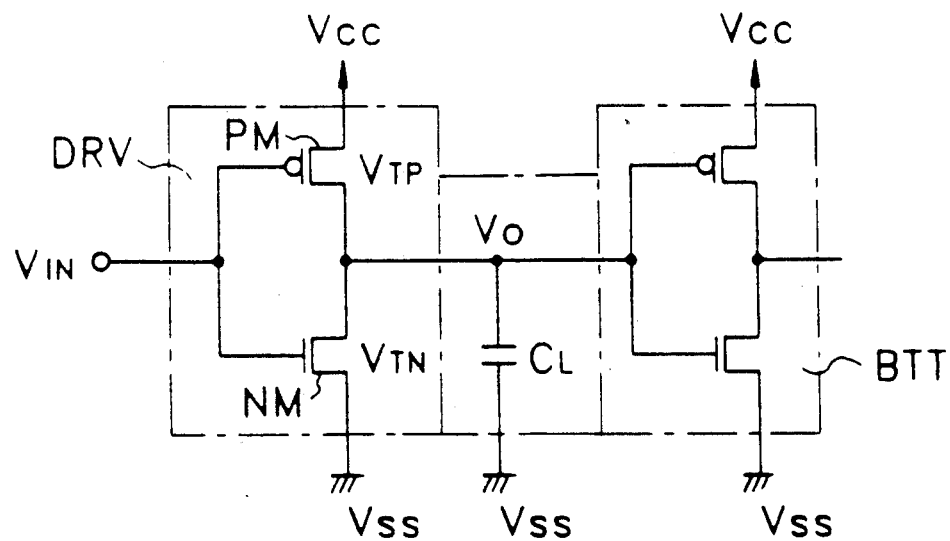
FIG. 1A is a circuit diagram of a conventional CMOS signal delay circuit.
Figure 1B:
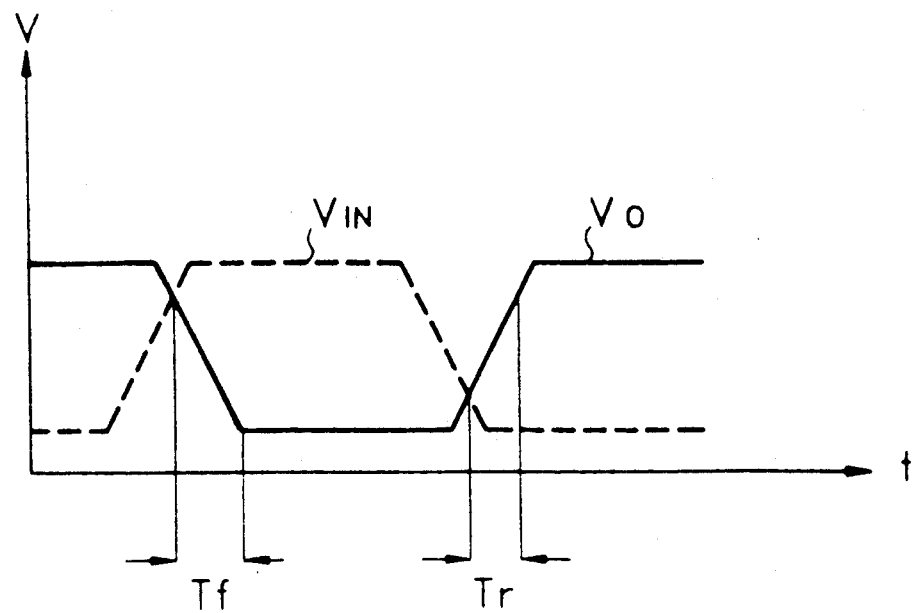
FIG. 1B is a signal waveform diagram showing an input and output waveform of the conventional CMOS signal delay circuit of FIG. 1A.
Figure 1C:
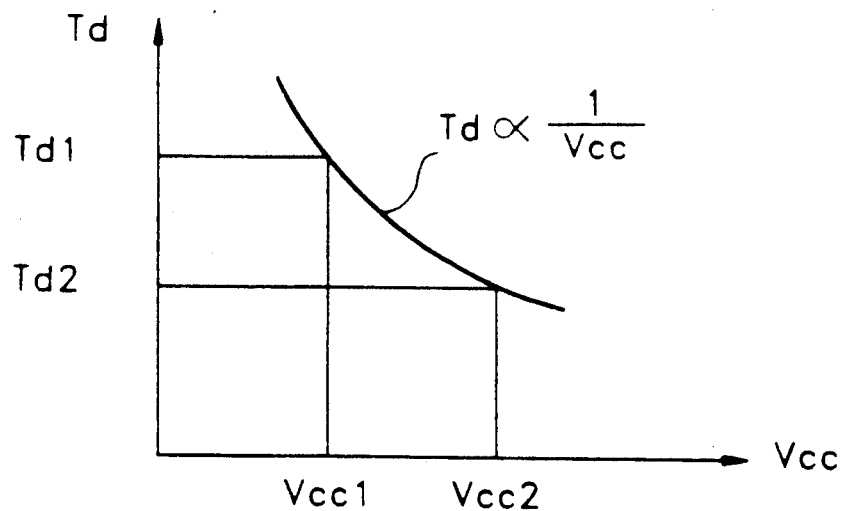
FIG. 1C is a graphic representation illustrating the time delay characteristic according to the supply voltage of the circuit of FIG. 1A.
Figure 2A:
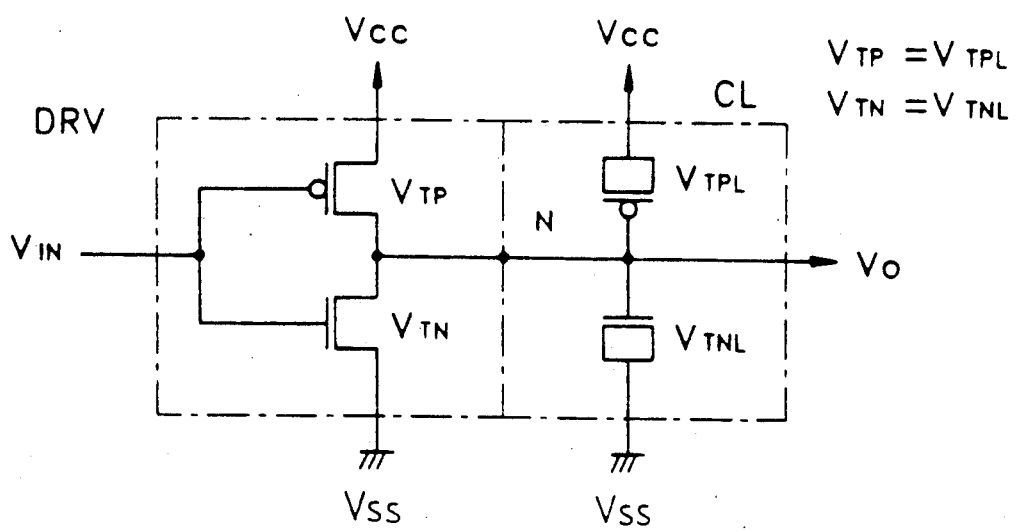
FIG. 2A is a circuit diagram of a CMOS signal delay circuit having conventional NMOS and PMOS capacitors.

FIG. 2A illustrates a conventional CMOS signal delay circuit having NMOS and PMOS capacitors, as a capacitive load.

In FIG. 2A, the conventional signal delay circuit consists of a driving circuit DRV and a capacitive load circuit CL. The driving circuit DRV consists of a CMOS inverter in which a pull-up PMOS transistor PM having a threshold voltage VTP and a pull-down NMOS transistor NM having a threshold voltage VTN are connected between the supply voltage Vcc and the ground voltage Vss or GND. An input signal VIN is applied to the gate electrodes of the transistors PM and NM, and the output signal Vo is developed at the common drain node according to the input signal VIN.

The capacitive load CL consists of an NMOS capacitor having a threshold voltage VTNL in which the gate electrode is connected to the common drain node N of transistors PM and NM, and the N+ source electrode (or N+ drain electrode) is connected to the ground voltage Vss, and a PMOS capacitor having a threshold voltage VTPL in which the gate electrode is connected to the common drain node N of transistors PM and NM, and the P+ source electrode (or P+ drain electrode) is connected to the supply voltage Vcc.

The threshold voltage VTNL of the NMOS capacitor and the threshold voltage VTPL of the PMOS capacitor respectively have the same values as the threshold voltage VTN of the pull-down NMOS transistor NM and the threshold voltage VTP of the pull-up PMOS transistor PM (i.e. VTNL=VTN, VTPL=VTP).

The C-V characteristic curve of this signal delay circuit of FIG. 2A is shown in FIG. 2B. Capacitive load CL has a first capacitive value until the output voltage of the signal delay circuit reaches the threshold voltage VTN of the NMOS transistor (or the threshold voltage VTNL of the NMOS capacitor), increases to a second capacitive value at the threshold voltage VTN of the NMOS transistor (or the threshold voltage VTNL of the NMOS capacitor) and keeps a second capacitive value until the output voltage of said signal delay circuit reaches the supply voltage Vcc - the threshold voltage VTP of PMOS transistor (or the threshold voltage VTPL of PMOS capacitor) and decreases to the first capacitive value at the supply voltage Vcc - the threshold voltage VTP of PMOS transistor (or the threshold voltage VTPL of PMOS capacitor).

An effective load capacitance is calculated as follows. In the case that the output voltage Vo fully swings within 0V~Vcc, the total amount of electric charge QT used in the change of the output voltage at the driving transistor is given by the following equation;

$$QT = \int_0^{Vcc} C_o(V_o) \cdot dV_o \qquad (3)$$

and is proportional to the area having oblique lines of FIG. 2B. The effective load capacitance Ceff is determined by the following equation;

$$Ceff = \frac{1}{Vcc} \int_0^{Vcc} C_o(V_o) \cdot dVO = \frac{QT}{Vcc} \qquad (4)$$

That is, the effective load capacitance Ceff is proportional to the total electric charge amount QT which is the integral function of the output voltage Vo.

Here, on the assumption that the threshold voltages VTN, VTP of transistors of the driving circuit DRV respectively have values of 0.7 V, −0.7 V, the effective load capacitance Ceff in the range of 4 V to 6 V is designated by Table 1 in the case of $$CA = \frac{Cmax}{2}$$ using the equations (3) and (4).

TABLE 1

| Vcc | 4 V | 5 V | 6 V |
|---|---|---|---|
| Ceff | 0.825 × Cmax | 0.86 × Cmax | 0.88 × Cmax |
| Ceff/Ceff(5 V) | 0.96 | 1.0 | 1.02 |

Figure 3B:
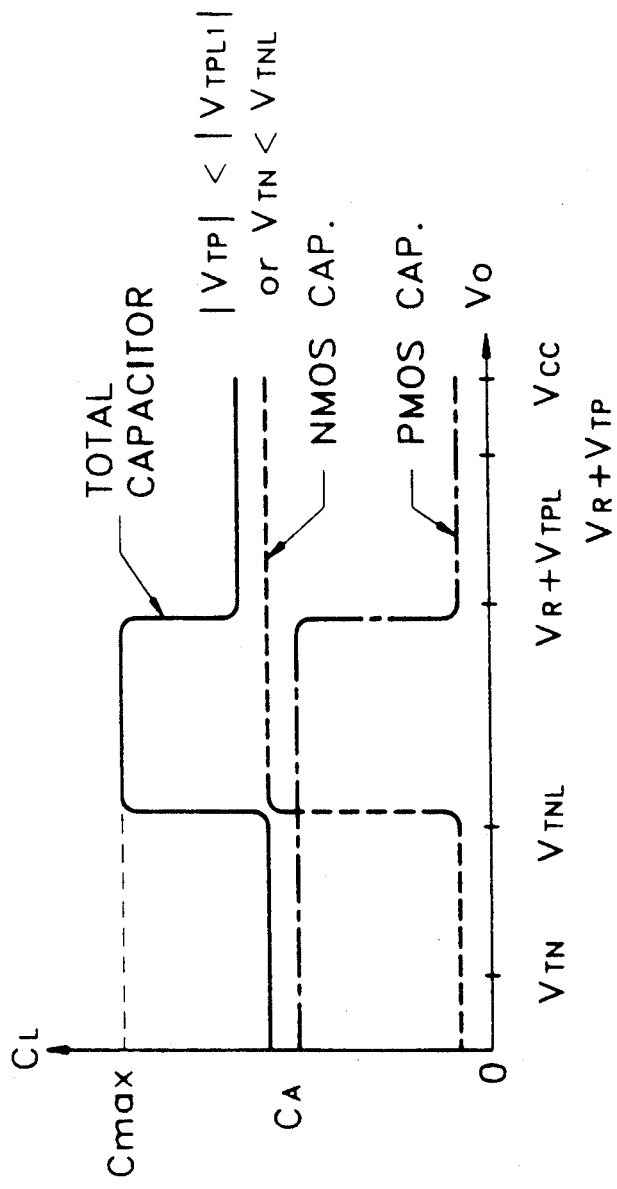
FIG. 3B illustrates the C-V characteristic of the circuit shown in FIG. 3A.
Figure 3A:
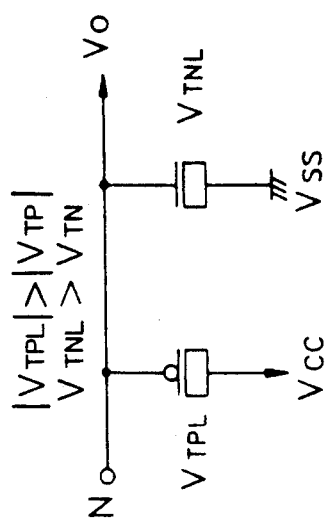
FIG. 3A is a circuit diagram of a load capacitive means of a CMOS signal delay circuit having NMOS and PMOS capacitors according to one embodiment of the present invention.

The capacitive load means of a CMOS signal delay circuit having an NMOS and PMOS capacitors according to the present invention is shown in FIG. 3A.

In FIG. 3A, the capacitive load means CL consists of a PMOS capacitor having a threshold voltage |VTP|<|VTPL| in which the gate electrode is connected to the common drain node N of the driving circuit DRV and the P+ source electrode (or P+ drain electrode) is connected to the supply voltage Vcc and a NMOS capacitor having a threshold voltage VTNL>VTN in which the gate electrode is connected to the common drain node N of driving circuit DRV and the N+ source electrode (or N+ drain electrode) is connected to the ground voltage Vss. In all embodiments of the present invention, the driving circuit DRV is the same as shown in FIG. 2A and thus is not shown for the sake of simplicity.

The C-V characteristic curve of this signal delay circuit is shown in FIG. 3B.

The load capacitance CL has a first capacitive value until the output voltage Vo of the signal delay circuit reaches the threshold voltage VTNL of the NMOS capacitor and increases to a second capacitive value at the threshold voltage VTNL of the NMOS capacitor and remains at the second capacitive value until the output voltage of the signal delay circuit reaches the sum of the supply voltage Vcc and the threshold voltage VTPL of the PMOS capacitor and decreases to a third capacitive value at the sum of the supply voltage Vcc and the threshold voltage VTPL of the PMOS capacitor and remains at the third capacitive value.

Here, on the assumption that the threshold voltages VTNL, VTPL of the driving circuit DRV respectively have values 2 V, −2 V, the effective load capacitance Ceff in the range of 4 V to 6 V is designated by table 2 in the case of $$CA = \frac{Cmax}{2}$$

using the equations (3) and (4).

TABLE 2

| Vcc | 4 V | 5 V | 6 V |
|---|---|---|---|
| Ceff | 0.5 × Cmax | 0.6 × Cmax | 0.66 × Cmax |
| Ceff/Ceff(5 V) | 0.83 | 1.0 | 1.1 |

On comparing table 1 and table 2, it will be seen that the variation of the effective load capacitance Ceff according to the fluctuation of the operating voltage in table 2 is larger than that in table 1. Accordingly, it is possible to shorten the delay time according to the fluctuation of the operating voltage by the circuit shown in FIG. 3A as opposed to the prior art.

Figure 4A:
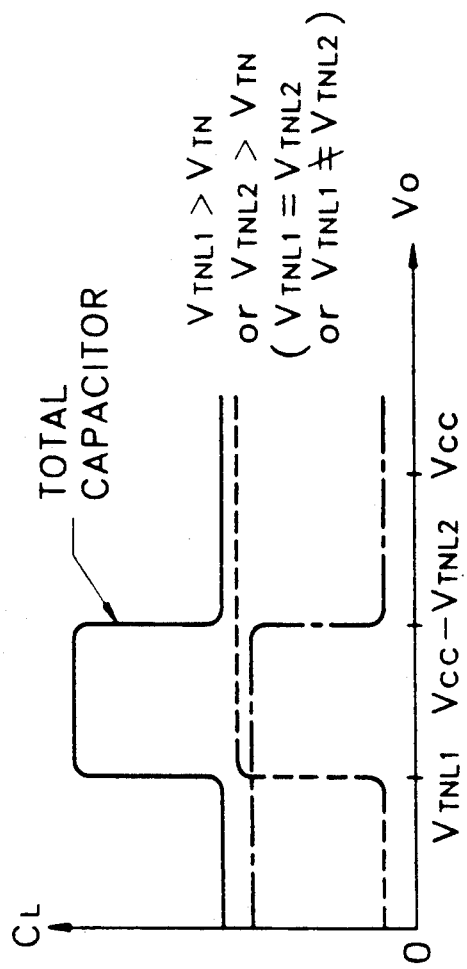
FIG. 4A is a circuit diagram of a load capacitive means of a CMOS signal delay circuit having NMOS capacitors according to a second embodiment of the present invention.

The capacitive load means CL using two NMOS capacitors is shown in FIG. 4A.

In FIG. 4A, the capacitive load consists of a first NMOS capacitor having a threshold voltage VTNL1>VTN in which the gate electrode is connected to the common drain node N of transistors PM and NM, and N+ source electrode (or N+ drain electrode) is connected to the ground voltage Vss and a second NMOS capacitor having a threshold voltage VTNL2>VTN in which the gate electrode is connected to the supply voltage Vcc, and N+ source electrode (or N+ drain electrode) is connected to the common drain node N of transistors PM and NM.

Figure 4B:
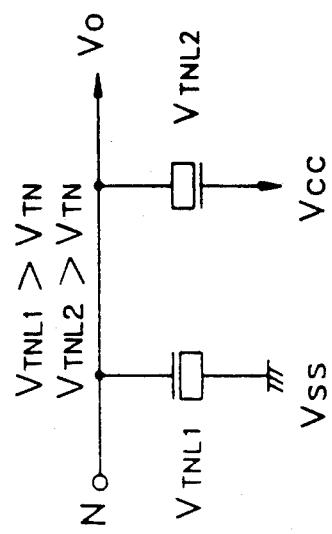
FIG. 4B illustrates the C-V characteristic of the circuit shown in FIG. 4A.

The C-V characteristic curve of this signal delay circuit is shown in FIG. 4B. The load capacitance CL has a first capacitive value until the output voltage of the signal delay circuit reaches the threshold voltage VTNL1 of the first NMOS capacitor and increases to a second capacitive value at the threshold voltage VTNL1 of the first NMOS capacitor and remains at the second capacitive value until the output voltage of the signal delay circuit reaches the difference between the supply voltage Vcc and the threshold voltage VTNL2 of the second NMOS capacitor and decreases to a third capacitive value at the difference between the supply voltage Vcc and the threshold voltage VTNL2 of the second NMOS capacitor and remains at the third capacitive value.

Also, in case that the threshold voltages VTNL1, VTNL2 of the capacitive load are equal, the C-V characteristic curve is in symmetry with respect to the center value $$\frac{Vcc}{2},$$

and in the case where the threshold voltage VTNL1 of the first NMOS capacitor is larger than the threshold voltage VTN of the driving circuit DRV and the threshold voltage VTNL2 of the second NMOS capacitor and the threshold voltage VTN of the driving circuit DRV are equal, the load capacitance of the C-V characteristic curve has a low load capacitance value between the threshold voltage VTN of the driving circuit DRV and the threshold voltage VTNL of a NMOS capacitor on comparing the C-V characteristic curve shown in FIG. 2B. Accordingly, the rise delay time during which the output voltage Vo varies from the ground voltage Vss to the supply voltage Vcc can be kept short and the fall delay time during which the output voltage Vo varies from the supply voltage Vcc to the ground voltage Vss can be kept long. That is, control of the rise and the fall delay time is possible by the adjustment of the threshold voltages VTNL1, VTNL2 of the capacitive load.

Figure 5A:
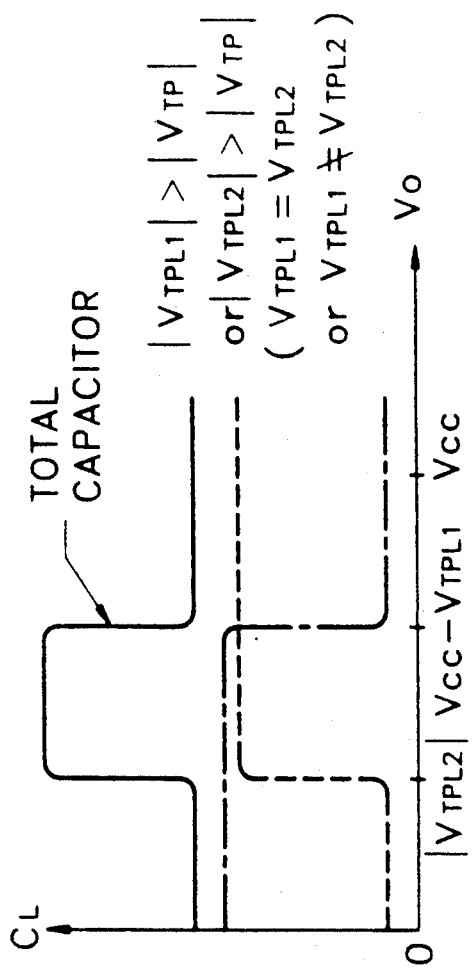
FIG. 5A is a circuit diagram of a load capacitive means of a CMOS signal delay circuit having PMOS capacitors according to a third embodiment of the present invention.

The capacitive load having two PMOS capacitors is shown in FIG. 5A.

In FIG. 5A, the capacitive load CL consists of a first PMOS capacitor having a threshold voltage |VTPL1|>|VTP| in which the gate electrode is connected to the common drain node N of transistors PM and NM, and P+ source electrode (or P+ drain electrode) is connected to the supply voltage Vcc and a second PMOS capacitor having a threshold voltage |VTPL2|>|VTP| in which the gate electrode is connected to the ground voltage Vss, and P+ source electrode (or P+ drain electrode) is connected to the common drain node N of transistors PM and NM.

Figure 5B:
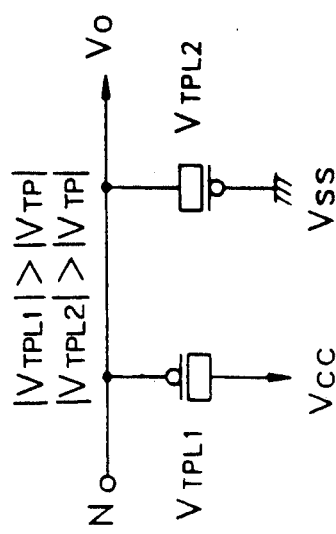
FIG. 5B illustrates the C-V characteristics of the circuit shown in FIG. 5A.

The C-V characteristic curve of this signal delay circuit is shown in FIG. 5B.

The load capacitance CL has a first capacitive value until the output voltage of the signal delay circuit reaches the threshold voltage |VTPL2| of the second PMOS capacitor and increases to a second capacitive value at the threshold voltage |VTPL2| of the second PMOS capacitor and remains at the second capacitive value until the output voltage of the signal delay circuit reaches the difference between the supply voltage Vcc and the threshold voltage VTPL1 of the first PMOS capacitor and decreases to a third capacitive value at the difference and remains at the third capacitive value.

The signal delay circuit shown in FIG. 4A and FIG. 5A is capable of having the C-V characteristic curve of the circuit shown in FIG. 3B.

Figure 6B:
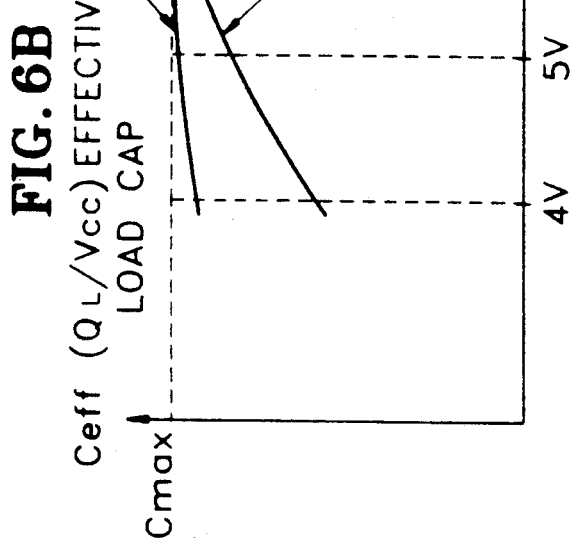
FIG. 6B is a graphic representation comparing the conventional circuit of FIG. 2A with the circuit of FIG. 3A of the present invention in the regard of the effective load capacitance Ceff as against the supply voltage Vcc characteristic.
Figure 6A:
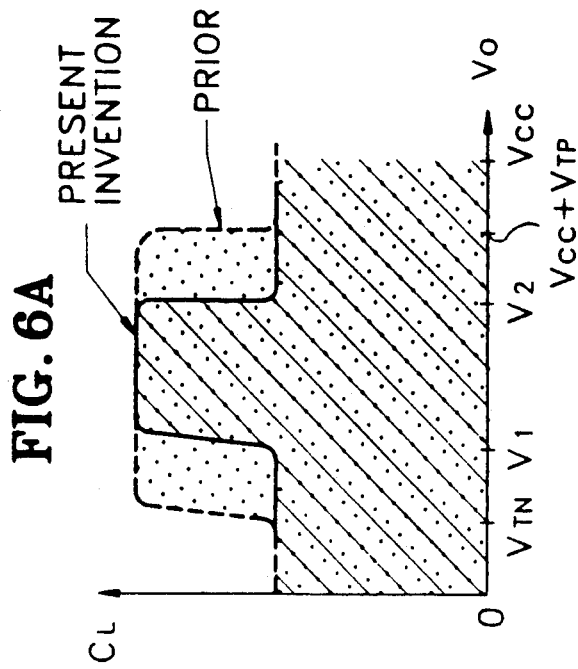
FIG. 6A is a graphic representation comparing the C-V characteristic of the circuits shown in FIG. 2A and FIG. 3A.

Comparison of the C-V characteristic curve of FIG. 2B and FIG. 3B is shown in FIG. 6A.

Comparison of variation of the effective load capacitance Ceff according to the supply voltage Vcc of signal delay circuits shown in FIG. 2A and FIG. 3A is shown in FIG. 6B. The variation of effective load capacitance of the signal delay circuit according to the present invention is larger than that of the prior art.

Figure 7B:
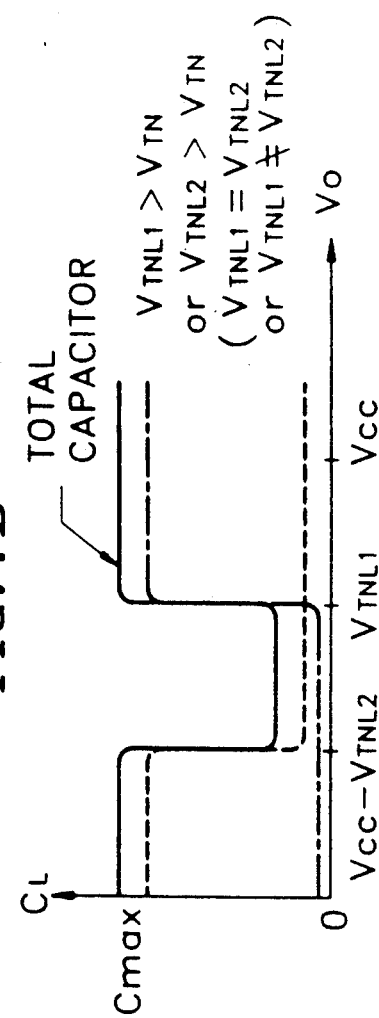
FIG. 7B illustrates the C-V characteristic of the circuit shown in FIG. 7A.
Figure 7A:
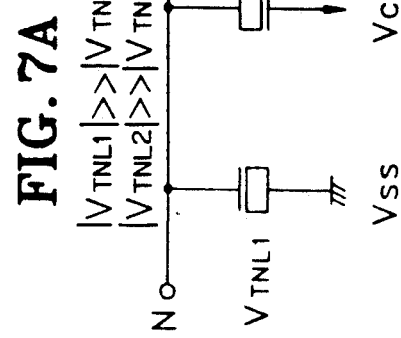
FIG. 7A is a circuit diagram of a load capacitive means of a CMOS signal delay circuit having NMOS capacitors according to the present invention.

The capacitive load having two NMOS capacitors is shown in FIG. 7A.

The circuit construction of FIG. 7A is equal to that of FIG. 4A and the absolute value of the threshold voltages VTNL1, VTNL2 of the NMOS capacitors shown in FIG. 7A are larger than those of the NMOS capacitors shown in FIG. 4A.

The C-V characteristic curve of this signal delay circuit is shown in FIG. 7B.

The load capacitance CL has a first capacitive value until the output voltage of said signal delay circuit reaches the difference between the supply voltage Vcc and the threshold voltage VTNL2 of the second NMOS capacitor and decreases to a second capacitive value at the difference and remains at the second capacitive value until the output voltage of the signal delay circuit reaches the threshold voltage VTNL1 of the first NMOS capacitor and increases to a third capacitive value at the threshold voltage VTNL1 and remains at the third capacitive value.

Here, on the assumption that the threshold voltages VTNL1, VTNL2 of the NMOS capacitors have values 3 V, −3 V respectively, the effective load capacitance Ceff in the operating voltage range of 4 V to 6 V as in the case of CA=Cmax is designated by table 3.

TABLE 3

| Vcc | 4 V | 5 V | 6 V |
| --- | --- | --- | --- |
| Ceff | 0.5 × Cmax | 0.8 × Cmax | Cmax |
| Ceff/Ceff(5 V) | 0.63 | 1.0 | 1.25 |

On comparing table 2 and table 3, the variation of the effective load capacitance Ceff according to the fluctuation of the operating voltage in table 3 is larger than that in table 2. Accordingly, it is possible to decrease the delay time according to the fluctuation of the operating voltage.

Figure 8B:
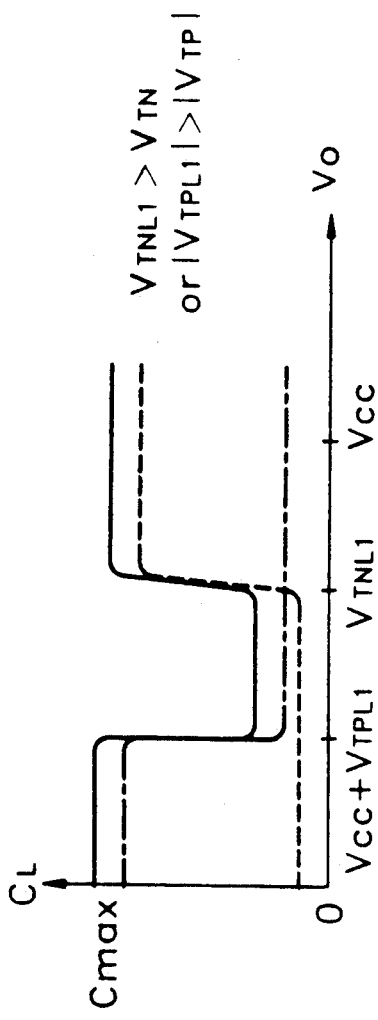
FIG. 8B illustrates the C-V characteristic of the circuit shown in FIG. 8A.
Figure 8A:
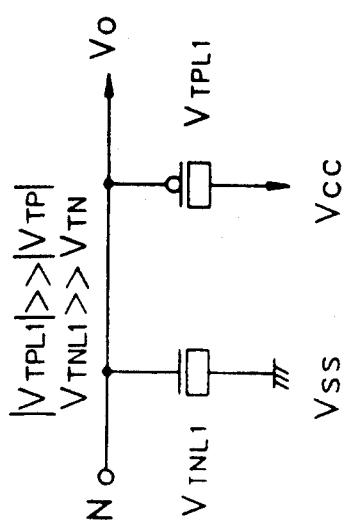
FIG. 8A is a circuit diagram of a load capacitive means of a CMOS signal delay circuit having NMOS and PMOS capacitors according to the present invention.

The capacitive load having a NMOS capacitor and a PMOS capacitor is shown in FIG. 8A.

The circuit construction of FIG. 8A is equal to that of FIG. 3A. And the absolute value of the threshold voltage VTPL of the PMOS capacitor shown in FIG. 8A is larger than the absolute value of the threshold voltage VTP of the PMOS transistor PM of the driving circuit DRV and the value of the threshold voltage VTNL of the NMOS capacitor is larger than the value of the threshold voltage VTN of the NMOS transistor NM of the driving circuit DRV.

The C-V characteristic curve of this capacitive load is shown in FIG. 8B. The load capacitance CL has a first capacitive value until the output voltage of the signal delay circuit reaches the sum of the supply voltage Vcc and the threshold voltage VTPL of the PMOS capacitor and decreases to a second capacitive value at the sum and remains at the second capacitive value until the output voltage of the signal delay circuit reaches the threshold voltage VTNL of the NMOS capacitor and increases to a third capacitive value at the threshold voltage VTNL of the NMOS capacitor and remains at the third capacitive value.

Figure 9B:
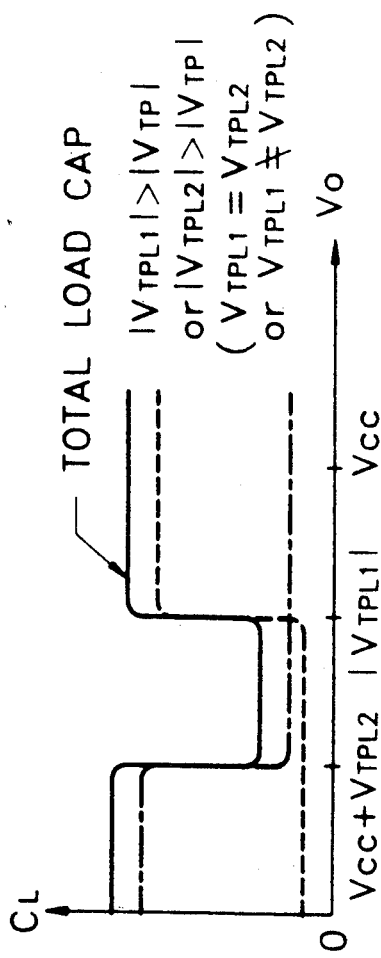
FIG. 9B illustrates the C-V characteristic of the circuit shown in FIG. 9A.
Figure 9A:
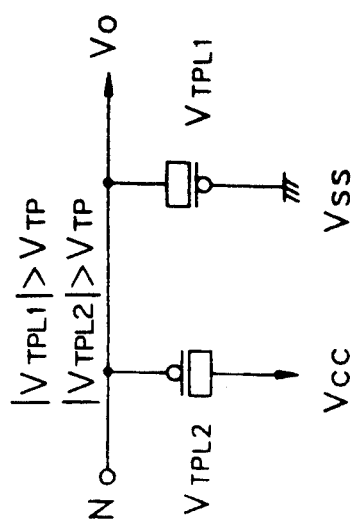
FIG. 9A is a circuit diagram of a load capacitive means of a CMOS signal delay circuit having PMOS capacitors according to the present invention.

The capacitive load means CL having two PMOS capacitors is shown in FIG. 9A. The circuit construction of FIG. 9A is equal to that of FIG. 5A. The absolute values of the threshold voltage VTPL1, VTPL2 of two PMOS capacitors shown in FIG. 9A are smaller than those of two PMOS capacitors shown in FIG. 5A.

The C-V characteristic curve of this capacitive load is shown in FIG. 9B. The load capacitance CL has a first capacitive value until the output voltage of the signal delay circuit reaches the supply voltage Vcc+ the threshold voltage VTPL2 of the PMOS capacitor and decreases to a second capacitive value at the supply voltage Vcc+ the threshold voltage VTPL2 of the PMOS capacitor and remains at the second capacitive value until the output voltage of the signal delay circuit reaches the threshold voltage |VTPL1| of the PMOS and increases to a third capacitive value at the threshold voltage |VTPL1| of the PMOS capacitor and remain at the third capacitive value.

Figure 10A:
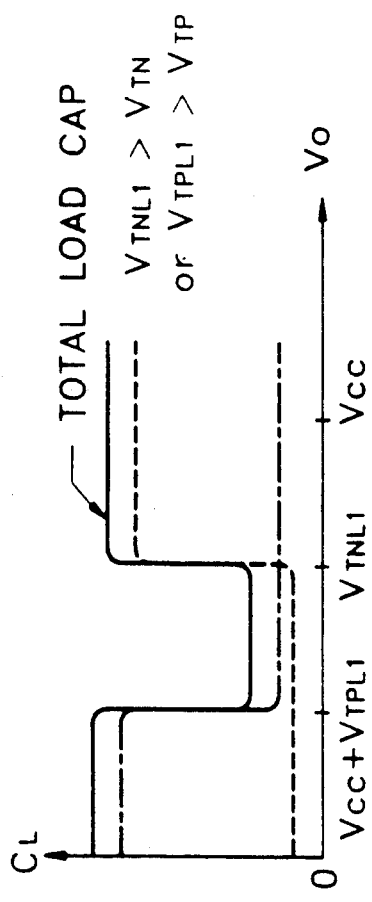
FIG. 10A is a circuit diagram of a load capacitive means of a CMOS signal delay circuit having NMOS and PMOS capacitors according to the present invention.

The capacitive load having one PMOS capacitor and one NMOS capacitor is shown in FIG. 10A.

The capacitive load CL consists of the PMOS capacitor having the threshold voltage VTPL in which the gate electrode is connected to the supply voltage Vcc and P+ source electrode (or P+ drain electrode) is connected to the common drain node N of the transistors PM and NM and the NMOS capacitor having the threshold voltage VTNL in which the gate electrode is connected to the common drain node N of the transistors PM and NM and N+ source electrode (or N+ drain electrode) is connected to the ground voltage Vss. The absolute values of the threshold voltages VTNL, VTPL of NMOS and PMOS capacitors shown in FIG.

10A are smaller than the absolute value of the threshold voltages VTNL, VTPL of NMOS and PMOS capacitors shown in FIG. 8A.

Figure 10B:
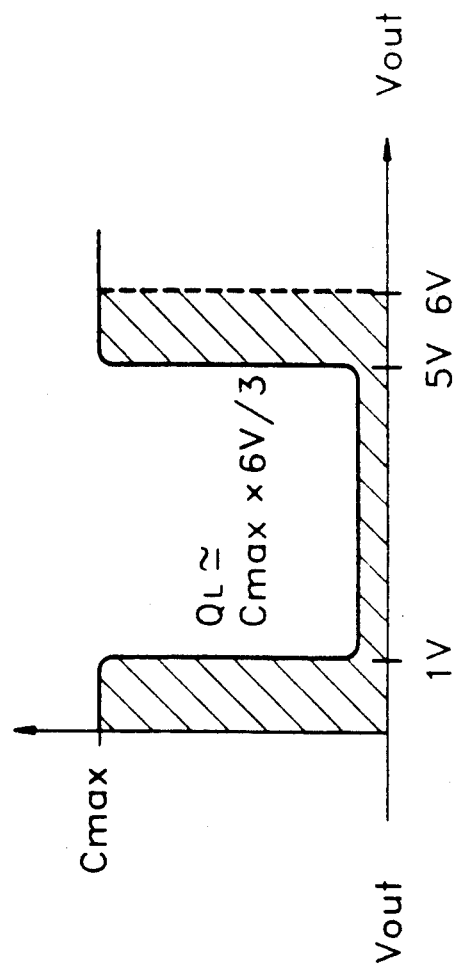
FIG. 10B illustrates the C-V characteristic of the circuit shown in FIG. 10A.

The C-V characteristic curve of this capacitive load is shown in FIG. 10B.

The capacitive load CL has a first capacitive value until the output voltage of the signal delay circuit reaches the sum of the supply voltage Vcc and the threshold voltage VTPL of the PMOS capacitor and decreases to a second capacitive value at the sum and remains at the second capacitive value until the output voltage of the signal delay circuit reaches the threshold voltage VTNL1 of the NMOS capacitor and increases to a third capacitive value at the threshold voltage VTNL1 of the NMOS capacitor and keeps the third capacitive value.

The C-V characteristic curve of circuits of FIG. 8A to FIG. 10A may be identical to the curve of FIG. 7B.

Figure 11A:
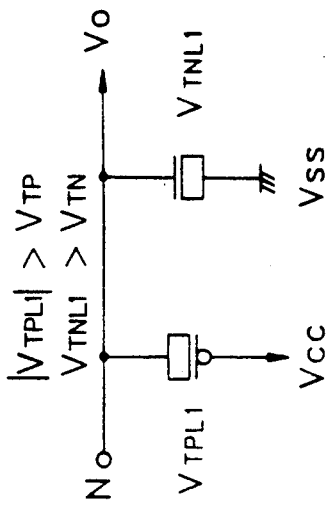
FIG. 11A is a graphic representation of the C-V characteristic of the circuit shown in FIG. 7A in the case of the supply voltage is 4 V and the threshold voltages of load capacitive means are 5 V.
Figure 11B:
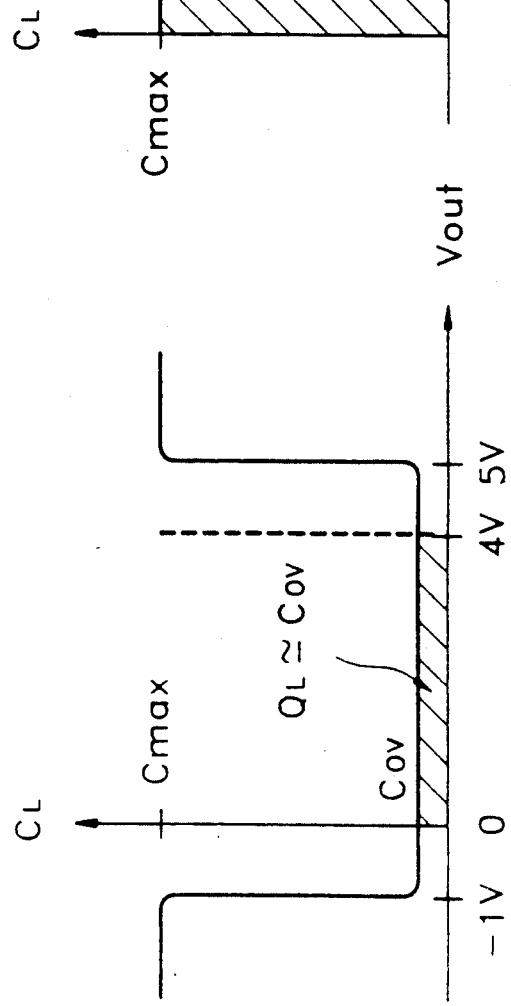
FIG. 11B is a graphic representation of C-V characteristic of the circuit shown in FIG. 7A in the case of the supply voltage is 6 V and the threshold voltage of load capacitive means are 5 V.

In the case that the supply voltage Vcc is 4 V and the threshold voltage VTNL1, VTNL2 of the capacitive load CL respectively is 5 V, the C-V characteristic curve of circuit shown in FIG. 7A is shown in FIG. 11A and the supply voltage Vcc is 6 V and the threshold voltage VTNL1, VTNL2 of the capacitive load CL respectively is 5 V, the C-V characteristic curve of circuit shown in FIG. 7A is shown in FIG. 11B.

On comparing the total amount of electric charge QT from FIG. 11A and FIG. 11B, the total electric amount QT of FIG. 11B is larger than that of FIG. 11A. Accordingly, to minimize the delay time at the low operating voltage is possible by a reduction of the total electric amount.

Figures 12A, 12B:
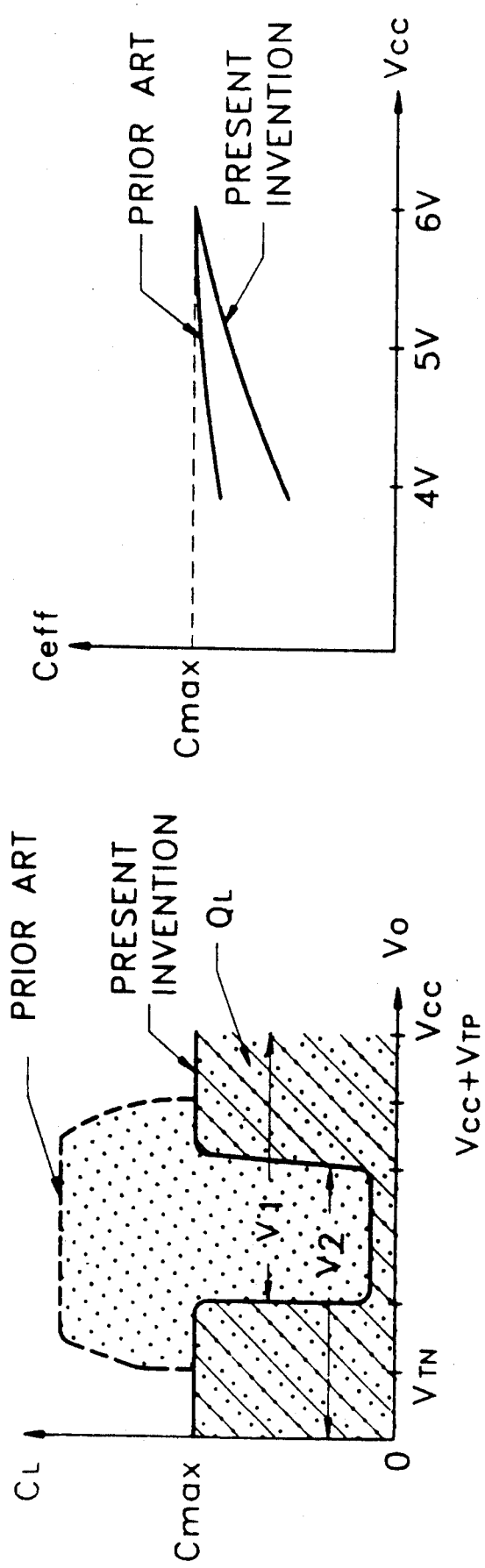
FIG. 12A is a graphic representation comparing the C-V characteristics of the circuits shown in FIG. 7A to FIG. 10A with that of the circuit shown in FIG. 2A.
FIG. 12B is a graphic representation comparing the effective load capacitance Ceff— the output voltage Vo characteristics of the circuits shown in FIG. 7A to FIG. 10A with that of the circuit shown in FIG. 2A.

Comparison of the C-V characteristic curve of circuits of FIG. 7A to FIG. 10A and that of FIG. 2A is shown in FIG. 12A. The dotted area of the graphic diagram indicates the total amount of electric charge of the circuit shown in FIG. 2A and the oblique line area of the graphic diagram indicates the total electric charge of the circuits shown in FIGS. 7A to 10A.

The graphic diagram indicating the fluctuation of the effective load capacitance according to the fluctuation of the supply voltage Vcc for the circuits of FIGS. 7A to 10A is shown in FIG. 12B. Here, it is noted that the fluctuation of the effective load capacitance is larger than not only that of the prior art but also that of FIG. 3A to FIG. 5A.

Also, it is possible to connect in parallel the capacitive load of the present invention and that of the prior art. In the above case, particularly in the case of a low load capacitive value at a low operating voltage shown in FIG. 11A, NMOS depletion capacitor which is independent from fluctuation of the supply voltage, can be used together.

Accordingly, the signal delay circuit of the present invention in which the absolute value of the threshold voltage of the capacitive load is larger than that of the driving circuit is able to improve the reliability of the semiconductor device by preventing the occurrence of race-around condition problems in high speed operation at a high operating voltage.

Also, the signal delay circuit of the present invention is able to perform a high speed operation at a low operating voltage by lowering the effective load capacitance at a low operating voltage.

And, the signal delay circuit of the present invention is able to keep the rise and fall delay time equal (making the C-V characteristic curve symmetrical) by varying capacitance values. On the other hand, the signal delay circuit can keep the rise and fall delay time unequal (making the C-V characteristic curve asymmetrical) by varying capacitance values.

What is claimed is:

1. A signal delay circuit having a load capacitance, comprising:

driving circuit means for developing an output signal at a node in response to an input signal, and including pull-up means coupled between said node and a supply voltage and pull-down means coupled between said node and ground voltage, said pull-up and pull-down means having predetermined respective threshold voltages; and capacitive load means coupled to said node for receiving said output signal and having at least one threshold voltage the absolute value of which is larger than the absolute value of a corresponding predetermined threshold voltage of said pull-up and pull-down means, such that the load capacitance of said signal delay circuit has a first capacitance value until said output signal rises to a first predetermined voltage, increases to a second capacitance value at said predetermined voltage, and decreases to a third capacitance value from said second capacitance value when said output signal rises to a second predetermined voltage.

2. A signal delay circuit as claimed in claim 1, wherein said capacitive load means consists of an NMOS capacitor in which a gate electrode is connected to said node and an N+ source electrode (or N+ drain electrode) is connected to the ground voltage, and a PMOS capacitor in which a gate electrode is connected to said node and a P+ source electrode (or P+ drain electrode) is connected to the supply voltage.

3. A signal delay circuit as claimed in claim 2, wherein said first voltage is the threshold voltage of said NMOS capacitor and said second voltage is the sum of said supply voltage and the threshold voltage of said PMOS capacitor.

4. A signal delay circuit as claimed in claim 1, wherein said capacitive load means consists of a first NMOS capacitor in which a gate electrode is connected to said node and an N+ source electrode (or N+ drain electrode) is connected to said ground voltage, and a second NMOS capacitor in which a gate electrode is connected to the supply voltage and an N+ source electrode (N+ drain electrode) is connected to said node.

5. A signal delay circuit as claimed in claim 4, wherein said first voltage is the threshold voltage of said first NMOS capacitor and said second voltage is a difference between said supply voltage and the threshold voltage of said second NMOS capacitor.

6. A signal delay circuit as claimed in claim 1, wherein said capacitive load means consists of a first PMOS capacitor in which a gate electrode is connected to said node and a P+ source electrode (P+ drain electrode) is connected to said supply voltage, and a second PMOS capacitor in which a gate electrode is connected to said ground voltage and a P+ source electrode (or P+ drain electrode) is connected to said node.

7. A signal delay circuit as claimed in claim 6, wherein said first voltage is the absolute value of the threshold voltage of said second PMOS capacitor and said second voltage is the sum of said supply voltage and the threshold voltage of said first PMOS capacitor.

8. A signal delay circuit having a load capacitance, comprising:
   driving circuit means for developing an output signal at a node in response to an input signal, and including pull-up means coupled between said node and a supply voltage and pull-down means coupled between said node and ground voltage, said pull-up and pull-down means having predetermined respective threshold voltages; and
   capacitive load means coupled to said node for receiving said output signal and having at least one threshold voltage the absolute value of which is larger than the absolute value of a corresponding predetermined threshold voltage of said pull-up and pull-down means, such that the load capacitance of said signal delay circuit has a first capacitance value until said output signal rises to a first predetermined voltage, decreases to a second capacitance value at said predetermined voltage, and increases to a third capacitance value from said second capacitance value when said output signal rises to a second predetermined voltage.

9. A signal delay circuit as claimed in claim 8, wherein said capacitive load means consists of a first NMOS capacitor in which a gate electrode is connected to said node and an N+ source electrode (or N+ drain electrode) is connected to said ground voltage, and a second NMOS capacitor in which a gate electrode is connected to said supply voltage and an N+ source electrode (or N+ drain electrode) is connected to said node.

10. A signal delay circuit as claimed in claim 9, wherein said first voltage is a difference between said supply voltage and the threshold voltage of said second NMOS capacitor and said second voltage is the threshold voltage of said first NMOS capacitor.

11. A signal delay circuit as claimed in claim 8, wherein said capacitive load means consists of a NMOS capacitor in which the gate electrode is connected to said node and an N+ source electrode (or N+ drain electrode) is connected to said ground voltage, and a PMOS capacitor in which the gate electrode is connected to said node and a P+ source electrode (or P+ drain electrode) is connected to said supply voltage.

12. A signal delay circuit as claimed in claim 11, wherein said first voltage is the sum of said supply voltage and the threshold voltage of said PMOS capacitor and said second voltage is the threshold voltage of said NMOS capacitor.

13. A signal delay circuit as claimed in claim 8, wherein said capacitive load means consists of a first PMOS capacitor in which a gate electrode is connected to said node and a P+ source electrode (or P+ drain electrode) is connected to said supply voltage, and a second PMOS capacitor in which the gate electrode is connected to said ground voltage and a P+ source electrode (or P+ drain electrode) is connected to said node.

14. A signal delay circuit as claimed in claim 13, wherein said first voltage is the sum of said supply voltage and the threshold voltage of said first PMOS capacitor and said second voltage is the absolute value of the threshold voltage of said second PMOS capacitor.

15. A signal delay circuit as claimed in claim 8, wherein said capacitive load means consists of a PMOS capacitor in which a gate electrode is connected to said supply voltage and a P+ source electrode (or P+ drain electrode) is connected to said node, and a NMOS capacitor in which a gate electrode is connected to said node and an N+ source electrode (or N+ drain electrode) is connected to said ground voltage.

16. A signal delay circuit as claimed in claim 15, wherein said first voltage is the sum of said supply voltage and the threshold voltage of said PMOS capacitor and said second voltage is the threshold voltage of said NMOS capacitor.

* * * * *